(12) United States Patent
Lebonheur et al.

(10) Patent No.: US 6,617,683 B2
(45) Date of Patent: Sep. 9, 2003

(54) THERMAL PERFORMANCE IN FLIP CHIP/ INTEGRAL HEAT SPREADER PACKAGES USING LOW MODULUS THERMAL INTERFACE MATERIAL

(75) Inventors: Vassoudevane Lebonheur, Tempe, AZ (US); Robert Starkston, Phoenix, AZ (US)

(73) Assignee: Intel Corporation, Santan Clara, CA (US)

( * ) Notice: Subject to any disclaimer, the term of this patent is extended or adjusted under 35 U.S.C. 154(b) by 0 days.

(21) Appl. No.: 09/964,709

(22) Filed: Sep. 28, 2001

(65) Prior Publication Data

US 2003/0067069 A1 Apr. 10, 2003

(51) Int. Cl.$^7$ .......................... H01L 23/34; H01L 21/48
(52) U.S. Cl. ...................... 257/707; 257/713; 257/720; 257/783; 438/118; 438/122
(58) Field of Search ................................. 257/678, 706, 257/707, 712, 713, 717, 720, 734, 737, 738, 773, 774, 778, 779, 780, 782, 783; 361/688, 704, 702, 703, 709, 710, 711, 717, 718; 488/106, 108, 118, 119, 121, 122, 125; 228/180.21, 180.22

(56) References Cited

U.S. PATENT DOCUMENTS

| | | | | |
|---|---|---|---|---|
| 3,905,037 A | * | 9/1975 | Bean et al. .................. | 257/506 |
| 5,552,635 A | * | 9/1996 | Kim et al. ................... | 257/706 |
| 5,587,882 A | * | 12/1996 | Patel ........................... | 361/705 |
| 6,162,663 A | * | 12/2000 | Schoenstein et al. ........ | 438/122 |
| 6,221,753 B1 | * | 4/2001 | Seyyedy ...................... | 438/613 |
| 6,317,326 B1 | * | 11/2001 | Vogel et al. ................. | 361/704 |
| 6,403,882 B1 | * | 6/2002 | Chen et al. ................. | 174/52.4 |

* cited by examiner

Primary Examiner—David L. Talbott
Assistant Examiner—Alonzo Chambliss
(74) Attorney, Agent, or Firm—Antonelli, Terry, Stout & Kraus, LLP

(57) ABSTRACT

A microprocessor package and a method of dissipating heat therefrom have improved thermal performance by utilizing low modulus thermal interface material between the flip chip, central processing unit and a heat spreader in the package. A modulus of elasticity of the thermal interface material in the kPa range is preferably provided by a cured, filled polymer gel which is lightly crosslinked. The gel thermal interface material enables the package to have a post end-of-line and post reliability testing thermal resistance across the thermal interface material between the flip chip and the heat spreader of <0.45 cm$^{2\circ}$ C./Watt. Mitigation of thin film cracking in die and prevention of interfacial delamination upon temperature cycling are also attained.

26 Claims, 4 Drawing Sheets

IHS with high Modulus TIM

IHS with low Modulus TIM

THERMAL PERFORMANCE IN FLIP CHIP/INTEGRAL HEAT SPREADER PACKAGES USING LOW MODULUS THERMAL INTERFACE MATERIAL

FIELD

The present invention relates to semiconductor die packages, especially microprocessor packages, and to effective heat dissipation from the packages for achieving high clock-speed targets of microprocessors.

BACKGROUND

Microprocessor packages that comprise a flip chip die, an integral heat spreader, and a thermal interface material between the back of the die and the integral heat spreader, are known. The thermal interface material plays the critical function of transferring the heat generated by the die to the integral heat spreader lid, which then spreads this heat to other elements such as heat sinks, etc. Heat removal becomes a challenge as the die power consumption, die size and heat density increases with every new generation of microprocessors. Thermal interface materials are used to effectively dissipate heat and reduce thermal resistance of the microprocessor packages. However, a problem in meeting this challenge is high thermal resistance caused by poor thermal interface material capability at end-of-line and/or failures in thermal interface materials post reliability testing. Finding a thermal solution to this problem is critical for achieving high clock-speed targets of microprocessors.

The most commonly used thermal interface materials consist of epoxy resins highly filled with metal or ceramic. These materials, even though they are highly thermally conductive, have significant integration issues with the other components of the package. The high modulus, in the GPa range, nature of crosslinked epoxies leads to severe delamination at the thermal interface material/die and/or thermal interface material/integral heat spreader interfaces which result in high contact resistance due to disruption of the heat conduction path between the die and the lid. Internal stresses are generated from the shrinkage of the polymer upon curing and cooling, and the coefficient of thermal expansion mismatch between the lid and the die. Thermal interface materials with high modulus cannot absorb such stresses which consequently get transferred to the interfaces and dissipated through catastrophic crack propagation mechanisms. Severe delamination can occur at the thermal interface material/die and/or thermal interface material/integral heat spreader interfaces, which result in high contact resistance.

Another important challenge presented by the new generation of microprocessors is to overcome die thin film cracking caused by die peel and shear stresses generated by high modulus thermal interface material in the flip chip/integral heat spreader package configuration. It has been found that thermal greases and phase change materials when used as thermal interface materials cannot meet the performance requirements for packages comprising an integral heat spreader. Greases are limited due to material pump-out during temperature cycling. Phase change materials do not possess high enough bulk thermal conductivities necessary to dissipate the high heats from the new generation of central processing units (CPUs), and they typically require the use of external clamps for the application of a constant positive force for optimum performance. There is a need for a method and package comprising an integral heat spreader, having improved thermal performance. The present invention addresses this need.

BRIEF DESCRIPTION OF THE DRAWINGS

The foregoing and a better understanding of the present invention will become apparent from the following detailed description of an example embodiment and the claims when read in connection with the accompanying drawings, all forming a part of the disclosure of this invention. While the foregoing and following written and illustrated disclosure focuses on disclosing an example embodiment of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

The present invention consists of utilizing low modulus thermal interface materials, in the kPa range as compared to GPa range observed for epoxies, for effective heat dissipation in semiconductor die packages, especially microprocessor packages that include an integral heat spreader to spread and dissipate the heat from the die to the ambient. The use of low modulus gel as the thermal interface material in integral heat spreader packages according to the example embodiment of the invention has resulted in significantly lower thermal resistance post end-of-line and post reliability testing and hence has enabled the necessary package thermal performance for a new generation of high clock-speed microprocessors.

Figure 1:
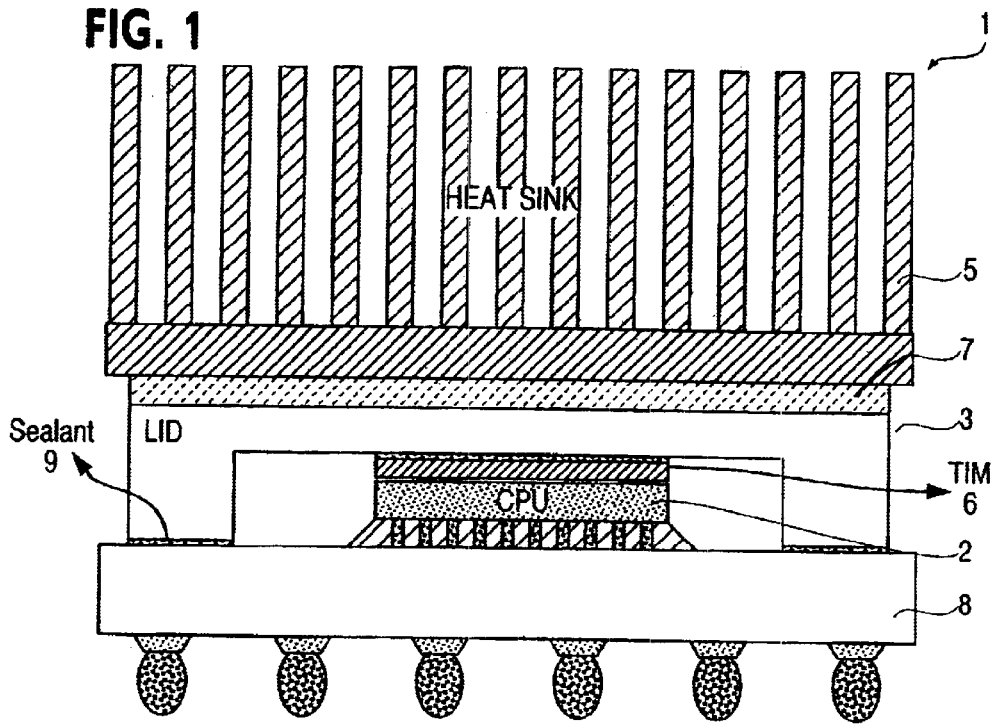
FIG. 1 is a schematic illustration of a microprocessor package of the present invention illustrating the flip chip/integral heat spreader configuration of the package.

The semiconductor die package 1 as shown in FIG. 1 is a microprocessor package having a flip chip die 2 constituting a central processing unit (CPU) of the package, an integral heat spreader 3 in the form of a lid and a thermal interface material 6 between the back of the die and the underside of the lid. The thermal interface material performs the critical function of transferring the heat generated by the die to the integral heat spreader lid, which then spreads this heat to a heat sink 5. A thermal grease 7 is located between the lid and the heat sink. The flip chip 2 is mounted at its front, lower surface as by soldering, for example, to a substrate 8 of the package. The substrate is preferably an organic or ceramic material. The lid in turn is mounted at its lower, peripheral surface to the substrate 8 of the package by a sealant 9, such as a polymer sealant adhesive, so as to extend over the back, top of the flip chip.

The thermal interface material 6 has a low modulus of elasticity, in the range of 1–500 kPa. The use of the highly conductive, low modulus gel as the thermal interface material 6 in the package has been found to decouple the stress transfer between the lid and die. The low modulus nature of the gel (kPa range compared to GPa range observed for epoxies as noted above) is effective to dissipate internal stresses and prevent interfacial delaminations at the interfaces of the material 6 with the die and integral heat spreader. The low modulus gel of the material 6 in the example embodiment is a polymer, namely silicone, which is filled with a fine, thermally conductive particulate material: one or more of a metal, such as aluminum and silver, and/or a ceramic, such as aluminum oxide and zinc oxide. The gel in the example embodiment was formulated using a silicone polymer, a crosslinking agent, a catalyst, a retarder and a surfactant which facilitates filler miscibility and compatibility. These gels are greases that are thermally cured into gels. Thus, they combine the properties of both greases and crosslinked thermal interface materials. The thermally cured gel in the example has modulus of elasticity in the range of 5–100 kPa, and most preferably 10–70 kPa.

Gel thermal interface material 6, before curing, has properties similar to greases, e.g., a high bulk thermal conductivity (1–20 W/m°K) and a low surface energy. It conforms well to surface irregularities upon being dispersed as a liquid onto the flip chip and/or lid and sandwiched therebetween during assembly of the package, which contributes to thermal contact resistance minimization. After assembly, the package is heated to thermally cure the gel material 6 and laminate it to the flip chip and lid. In the example embodiment curing is conducted at 125° C. for one hour. The thickness of the cured gel interface material 6 in the package 1 is on the order of 0.001–0.010 inch, but other thicknesses could be used.

Figure 3:
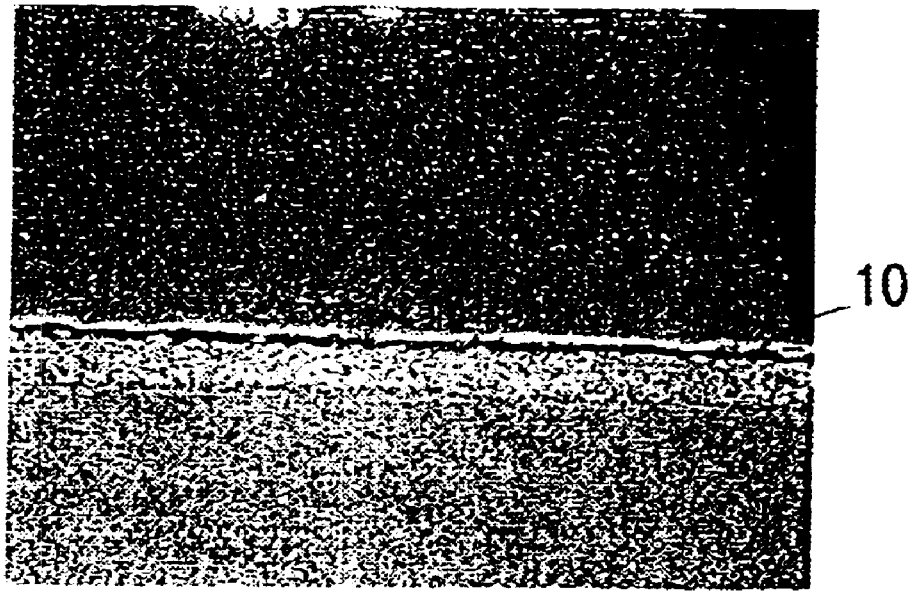
FIG. 3 is an optical micrograph showing delamination of the thermal interface material/integral heat spreader interface for an epoxy based thermal interface material.
Figure 4:
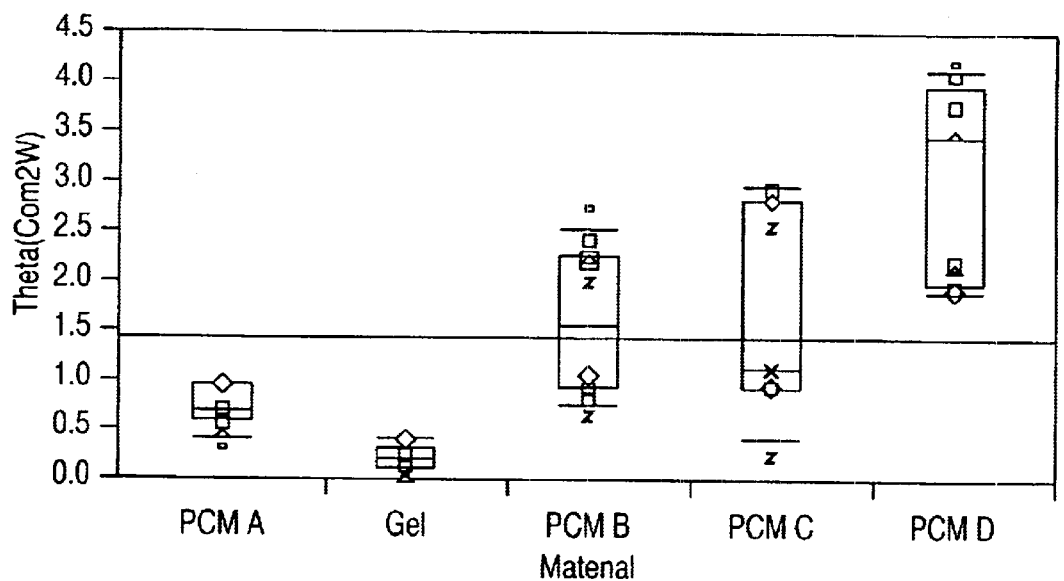
FIG. 4 is a graph of end-of-line thermal performance data (thermal resistance) of gel thermal interface materials in flip chip/integral heat spreader microprocessor packages of the present invention shown in comparison with data obtained for packages with various phase change materials as the thermal interface material.

The cured gel material is a lightly crosslinked filled polymer. The crosslinking reaction provides enough cohesive strength to the material to circumvent the pump-out exhibited by greases during temperature cycling. The modulus of elasticity of the cured gel material is low enough, in the kPa range compared to the GPa range observed for epoxies, that the material can still dissipate internal stresses and prevent interfacial delaminations. The superior thermal performance of packages of the present invention with the low modulus thermal interface material is demonstrated in FIGS. 2–4 wherein a comparison is made of packages of the invention (FIG. 4) with packages having high modulus epoxy thermal interface material (FIGS. 2 and 3) and phase change material thermal interface material (FIG. 4).

Figure 2:
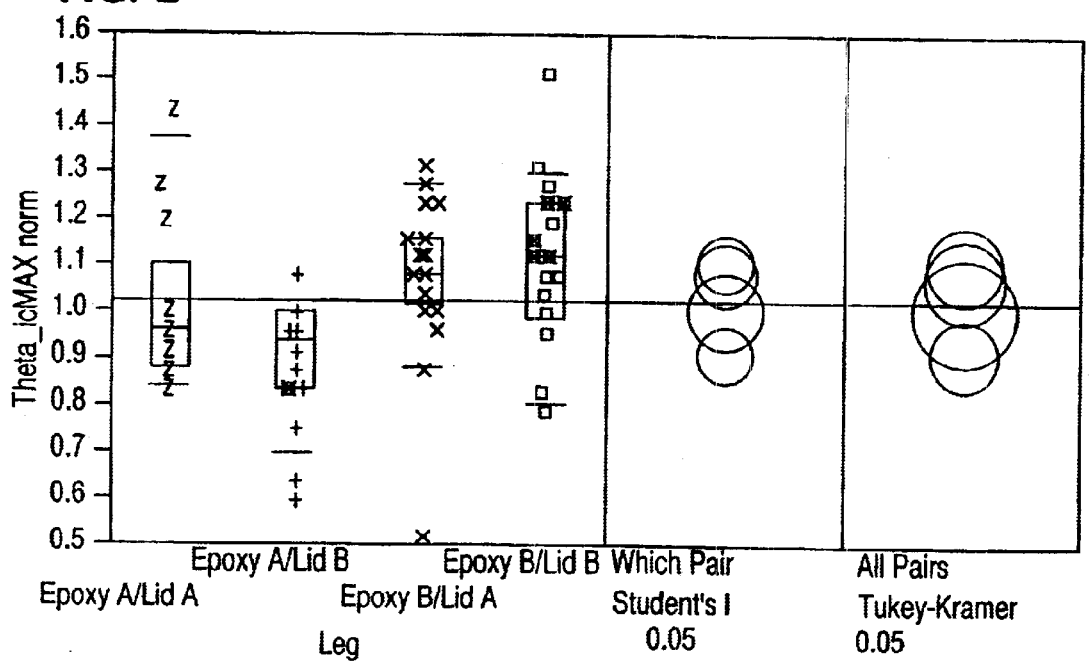
FIG. 2 is a graphical depiction of end-of-line thermal resistance (Theta(jc)max) data obtained with high modulus of elasticity Ag filled epoxy thermal interface materials A and B on two types of integral heat spreader lids A and B.

Measured data of the thermal performance of end-of-line packages with high modulus (in the range of GPa) epoxy thermal interface materials are shown in FIG. 2. Thermal performance is expressed by the measured thermal resistance, Theta(jc)max, from the junction of the die through the thermal interface material to the case of the package. Data is shown for packages with high modulus Ag filled epoxy thermal interface materials A and B on two types of integral heat spreader lids, A and B. The A lids were made of copper while the B lids were made of aluminum silicon carbide. The high values of Theta(jc)max, reported in FIG. 2, against thermal resistance targets of <1 cm$^{2o}$ C./Watt, and preferably <0.45 cm$^{2o}$ C./Watt, were found to be due to interfacial delaminations at the thermal interface material/integral heat spreader interface for the epoxy thermal interface material. An example of such a delamination is depicted at 10 in FIG. 3. Thermal and mechanical stress in the production process during manufacturing the packages are the cause of this delamination.

Likewise, none of the measured thermal performances of end-of-line packages with phase change materials (PCM) A, B, C and D used as thermal interface material in the packages achieved the target resistance of <0.45 cm$^{2o}$ C./Watt. The phase change materials A, B, C and D were Ag filled low molecular polymers. In contrast, the measured thermal resistance for end-of-line packages made according to the present invention with a low modulus, in the kPa range, gel thermal interface material as disclosed herein, met the target resistance of <0.45 cm$^{2o}$ C./Watt. See the data reported above the "Gel" notation in FIG. 4.

The improved thermal performance of the semiconductor die packages of the present invention has also been demonstrated from the results of temperature cycling tests on the packages. That is, the low modulus gel thermal interface material in the packages of the invention overcome the reliability and integration problems encountered in temperature cycling of packages with conventional high modulus epoxy thermal interface material. Table I below sets forth the test results of thermal resistance measurements from the junction of the die through the gel thermal interface material to the case of packages, according to the present invention for: (a) end-of-line (EOL) packages; (b) packages maintained at 130° C. under conditions of 85% humidity for 25 hours, and (c) packages thermally cycled 350 times between −55° C. and 125° C. As seen from Table I, mean thermal resistance was below target for the packages under all test conditions. To the contrary, the same temperature cycling tests of packages having high modulus thermal interface material such as Ag filled epoxy, resulted in catastrophic die thin film cracking and/or thin film delamination.

TABLE I

| Readout | mean | std dev | Target |
| --- | --- | --- | --- |
| TRES II (EOL) ° C. cm$^2$/W | 0.18 | 0.02 | 0.3 |
| 25 hr 130/85 ° C. cm$^2$/W | 0.26 | 0.07 | 0.3 |
| 350 cy TCK ° C. cm$^2$/W | 0.18 | 0.02 | 0.3 |

By way of explanation, stress simulations show that the thin film cracking (TFC) and thin film delamination (TFD)

risk associated with the thermal material, and proper selection of such, based on the mechanical properties can significantly mitigate TFC/TFD risk upon temperature cycling. Stress metrics, which capture the TFC/TFD risks, are the shear stresses and the normal (peel) stresses at the die corners on the die active side. The results of modeling these stresses are shown in FIG. 5 for packages with high modulus thermal interface material such as Ag filled epoxy with AlSiC and Cu lids (AlSiC, AB and Cu, AB), for packages with no lid and a thermal grease between the flip chip and the package case/heat sink (OLGA1), and for packages according to the present invention with low modulus gel thermal interface material with AlSiC and Cu lids (AlSiC, Gel and Cu, Gel).

Figure 5:
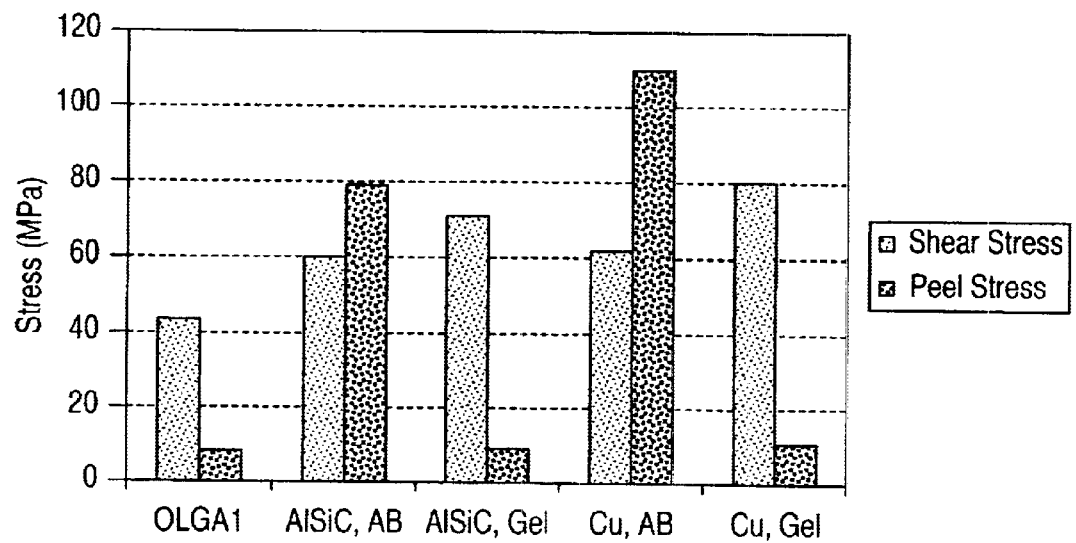
FIG. 5 is a graph comparing modeled shear and peel stresses for flip chip/integral heat spreader packages with copper/aluminum silicon carbide lids and high modulus of elasticity Ag filled epoxy thermal interface materials A and B with low modulus gel thermal interface materials according to the present invention, for packages subjected to temperature cycling from room temperature to −55° C.
Figure 6A:
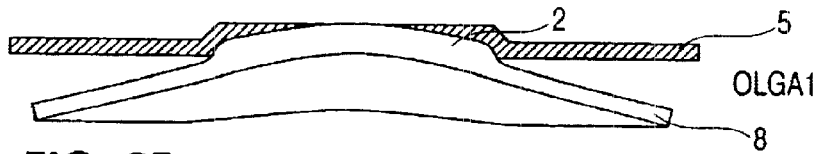
FIG. 6A is a cross-sectional view of the warpage of a flip chip/integral heat spreader package with no lid and with grease between the die and the outer package case or heat sink so the die is unconstrained, the warpage being shown for the package cooled to −55° C.
Figure 6B:
FIG. 6B is a cross-sectional view of the warpage of a flip chip/integral heat spreader package with a high modulus thermal interface material between the die and the lid of the package, the package being cooled to −55° C.
Figure 6C:
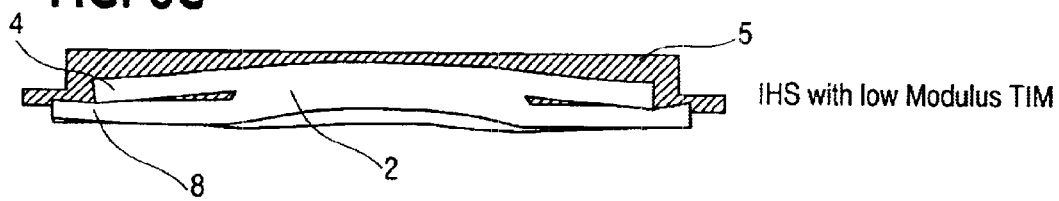
FIG. 6C is a cross-sectional view of the warpage of a flip chip/integral heat spreader package of the present invention with a low modulus gel thermal interface material between the lid and die of the package, at 130° C. and 85% relative humidity.

The modeled stresses in the graph of FIG. 5 show that the catastrophic die thin film cracking and thin film delamination which occurred in temperature cycling packages with the high modulus thermal interface material are due to extremely high peel stresses. The high peel stress can be attributed to the competing bending forces due to the coefficient of thermal expansion mismatches of the lid-die and die-substrate pairs, provided there is strong mechanical coupling between the components, which is present when epoxies are used. Based on modeling, the path to mitigate the peel stress level according to the present invention is to de-couple the lid and the die by selecting a thermal interface material with low modulus, such as a gel as discussed above. The warped shape of the packages (as shown in FIG. 6), demonstrates the effect of de-coupling and FIG. 5 shows order of magnitude reduction in the peel stress level by using a low modulus thermal interface material in the package of the invention. Therefore, selecting low modulus gel-type thermal interface material according to the present invention results in significant peel stress mitigation in addition to improved thermal performance.

Figure 7:
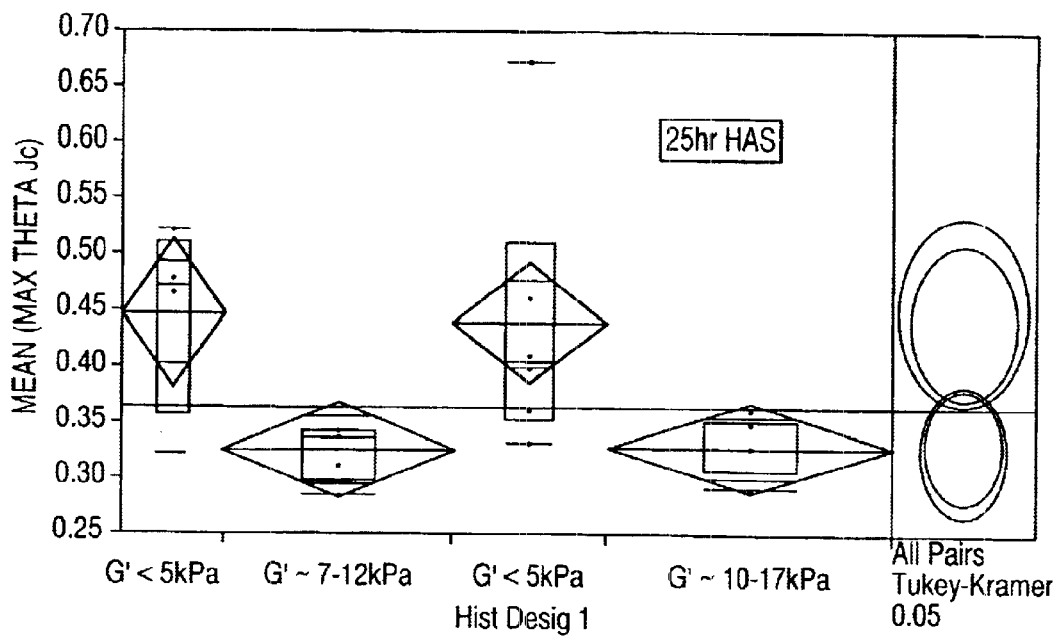
FIG. 7 is a graph showing modulation of the thermal performance Rjc, post thermal/humidity exposure, by gel modulus G'.

It has also been found that controlling the modulus of elasticity range of the gel thermal interface material in the method and package of the invention is critical for maintaining thermal performance in response to moisture stress of the package. Thermal resistance for packages maintained at 130° C., 85% humidity for twenty-five hours are shown in FIG. 7 as a function of the gel modulus of elasticity. Controlling the minimum modulus (i.e., increasing crosslinking/network density of the polymer system) was critical in reducing the rate of moisture diffusion in the thermal interface material and improving the cohesive strength of the material. As seen from the test results shown in FIG. 7, maintaining the modulus of the gel material to greater than 5 kPa resulted in significant improvement in package thermal performance in response to temperature/humidity exposure.

While we have shown and described one example embodiment in accordance with the present invention, it is understood that the same is not limited thereto, but is susceptible to numerous changes and modifications as known to those skilled in the art. For example, the invention is applicable to various types of electronic packages including microcontrollers, chipsets and network processors as well as microprocessor packages. Therefore, we do not wish to be limited to the details shown and described herein, but intend to cover all such changes and modifications as are encompassed by the scope of the appended claims.

We claim:

1. A semiconductor die package comprising:
   a semiconductor die;
   a heat spreader; and
   a thermal interface material between the semiconductor die and the heat spreader, wherein the thermal interface material has a modulus of elasticity in the range of 1–500 kPa, and wherein the post end-of-line and post reliability testing thermal resistance of the thermal interface between the semiconductor die and the heat spreader is <1 cm$^2$°C/Watt.

2. The semiconductor die package according to claim 1, further comprising a substrata on which the semiconductor die and heat spreader are mounted.

3. The semiconductor die package according to claim 1, further comprising a substrate, and wherein the semiconductor die is a hip chip mounted on the substrate.

4. The semiconductor die package according to claim 1 wherein the semiconductor die is a central processing unit of an electronic package.

5. The semiconductor die package according to claim 1, wherein the heat spreader comprises a lid in heat conducting relation with the semiconductor die via the thermal interface material mid wherein a heat sink is provided in heat conducting relation with the lid.

6. The semiconductor die package according to claim 1, wherein the interface material is a cured, crosslinked polymer gel.

7. The semiconductor die package according to claim 6, wherein the thermal interface material has a bulk thermal conductivity of 1–20 W/m°K.

8. The semiconductor die package according to claim 6, wherein the polymer gel is filled with material selected from the group consisting of metal and ceramic.

9. The semiconductor die package according to claim 1, wherein the thermal interface material has a bulk thermal conductivity of 1–20 W/m°K.

10. The semiconductor die package according to claim 1, wherein the thermal interface material is a gel which has a thickness between the semiconductor die and the heat spreader in the range of 0.001–0.010 inch.

11. A semiconductor die package comprising:
    a semiconductor die;
    a heat spreader; and
    a thermal interface material between the semiconductor die and the heat spreader, wherein the thermal Interface material hose modulus of elasticity In the range of >5 kps–500 kPa, and
    wherein the thermal interlace material is a cured, crosslinked polymer gel which is filled with material selected from the group consisting of metal end ceramic.

12. A method of making a semiconductor die package comprising:
    assembling a semiconductor die and a heat spreader with a thermally conductive gel therebetween; and
    curling the gel to form a thermal interface material which has a modulus of elasticity in the range of 1–500 kPa, and wherein the thermal resistance of the cured gel between the semiconductor die and the heat spreader is <1 cm$^2$°C/Watt.

13. The method according to claim 12, wherein the gel is a polymer which, after the curing, is lightly crosslinked.

14. The method according to claim 13, wherein the polymer is filled with material selected from the group consisting of metal and ceramic.

15. The method according to claim 12, wherein the gel has a bulk thermal conductivity of 1–20 W/m°K.

16. The method according to claim 12, wherein the thickness of the gel between the semiconductor die and the heat spreader is in the range of 0.001–0.010 inch.

17. A method of making a semiconductor die package comprising:

assembling a semiconductor die and a heat spreader with a thermally conductive gel between; and curing the get to form a thermal Interface material which has a modulus of elasticity in the range of >5 kPa–500 kPa, and wherein the thermal resistance of the cured gel between the semiconductor die and the heat spreader is <1 cm$^2$°C/Watt.

18. The method according to claim 12, including mounting the semiconductor die mid heat spreader on a substrate.

19. The method according to claim 12, wherein the semiconductor die is a flip chip mounted on a substrate.

20. The method according to claim 19, wherein the heat spreader comprises a lid which is mounted on the substrate during the assembling so as to extend over the flip chip.

21. The method according to claim 12, wherein the semiconductor die is a central processing unit of an electronic package.

22. A method of dissipating heat from a semiconductor die package comprising:

transferring heat from a semiconductor die in a semiconductor die package to a heat spreader in the package with a thermal interface material between the semiconductor die and the heat spreader;

wherein the thermal interface material is a gel which has a modulus of elasticity in the range of 1–500 kPa, and wherein The thermal resistance of the gel is <1 cm$^2$°C/Watt.

23. A method of dissipating heat from a semiconductor die package, comprising:

transferring heat from a semiconductor die in a semiconductor die package to a heal spreader in the package with a thermal interlace material between the semiconductor die and the heat spreader;

wherein the thermal interface material is a cured crosslinked polymer gel which is filled with material selected from the group consisting of metal and ceramic.

24. The method according to claim 22, wherein the semiconductor die package is an electronic package and the semiconductor die is a flip chip, central processing unit.

25. A microprocessor package comprising:

a flip chip, central processing unit mounted at a front thereof on a substrate;

a lid mounted on the substrate so as to extend over a back of the flip chip; and a thermal interface material between the underside of the lid and the back of the flip chip, the thermal interface material being a gel which has a modulus of elasticity in the range of 1–500 kPa and a thermal resistance of <1 cm$^2$°C/Watt.

26. The microprocessor package according to claim 25, further comprising a heat sink in heat conducting relation with the lid.

* * * * *